United States Patent [19]

Tsugita

[11] Patent Number: 5,834,984
[45] Date of Patent: Nov. 10, 1998

[54] CURRENT CONTROLLED OSCILLATOR

[75] Inventor: Masami Tsugita, Tokyo, Japan

[73] Assignee: NEC Corporation, Japan

[21] Appl. No.: 828,744

[22] Filed: Mar. 26, 1997

[51] Int. Cl.$^6$ .................................................. H03K 3/26
[52] U.S. Cl. ................................... 331/111; 331/176
[58] Field of Search ..................................... 331/111, 176

[56] References Cited

U.S. PATENT DOCUMENTS 4,063,193 12/1977 Wilcox ................................ 331/117 R
5,151,667 9/1992 Nishijima ............................ 331/117 R

FOREIGN PATENT DOCUMENTS 2312313 12/1990 Japan .
 946188 2/1997 Japan .

*Primary Examiner*—David Nelms
*Assistant Examiner*—Hien Nguyen
*Attorney, Agent, or Firm*—Hayes, Soloway, Hennessey, Grossman & Hage, P.C.

[57] ABSTRACT

A current controlled oscillator is provided for reducing oscillation frequency variation because of temperature dependence of the current amplification efficiency of transistors, comprising a differential amplifier having a pair of transistors, a capacitor collected between collectors of the pair of transistors, and a positive feedback circuit for turning each of the pair of transistors to ON and OFF alternately and complementarily. A temperature compensation circuit is provided for supplying one of the collectors of the pair of transistors with a compensation current proportional to a base current of one of the pair of transistors at status ON together with a constant current.

3 Claims, 4 Drawing Sheets

CURRENT CONTROLLED OSCILLATOR

BACKGROUND OF THE INVENTION

1. Field of the Invention

The present invention relates to a current controlled oscillator circuit. Particular utility for the present invention is for use in an IC (Integrated Circuit); although other utilities are contemplated herein.

2. Description of Related Art

A current controlled oscillator is a comparatively simple oscillator convenient to be integrated on an IC chip.

FIG. 3 is a circuit diagram illustrating an example of a conventional current controlled oscillator, comprising:

- a Darlington connection of a fifth and a sixth transistors Q5 and Q6 of npn type with their collectors supplyed with a positive supply VCC;
- a third and a fourth constant current source I3 and I4, each connected between an negative supply and each emitter of the fifth and the sixth transistors Q5 and Q6, respectively;
- a second resistor R2 connected between the positive supply VCC and base of the fifth transistor Q5;
- a third transistor Q3 of npn type with its collector supplied with the positive supply VCC through a first resistor R1 and its base coupled to the emitter of the sixth transistor Q6;
- a fourth transistor Q4 of npn type with its collector connected to the base of the fifth transistor Q5 and its emitter coupled to emitter of the third transistor Q3 and connected to the negative supply through a second constant current source I2;
- a first transistor Q1 of npn type with its collector supplied with the positive supply VCC and its base connected to the emitter of the sixth transistor Q6;
- an eighth and a ninth transistors Q8 and Q9 of pnp type with their bases coupled with each other and their emitters supplied with the positive supply VCC through a third and a fourth resistor R3 and R4 respectively;
- a second transistor Q2 of npn type with its collector coupled to collector of the eighth transistor Q8;
- a capacitor C connected between collectors of the first and the second transistors Q1 and Q2;
- an eleventh transistor Q11 of npn type with its collector coupled to emitters of the first and the second transistors Q1 and Q2 and its emitter connected to the negative supply through a fifth resistor R5;
- a seventh transistor Q7 of npn type with its emitter connected to the negative supply through a fifth constant current source I5, its collector supplied with the positive supply VCC and its base connected to collector of the second transistor Q2;
- a tenth transistor Q10 of pnp type with its emitter connected to bases of the eighth and the ninth transistors Q8 and Q9, its base connected to collector of the ninth transistor Q9 and its collector connected to the negative supply;
- an twelfth transistor Q12 of npn type with its collector coupled to collector of the ninth transistor Q9, its base connected to base of the eleventh transistor Q11 and its emitter connected to the negative supply through a sixth resistor R6;
- a fifteenth transistor Q15 of npn type with its collector supplied with the positive supply through a first constant current source I1, its emitter connected to the negative supply through a seventh resistor R7 and its base connected to bases of the eleventh and twelfth transistors Q11 and Q12; and
- a fourteenth transistor Q14 of npn type with its collector supplied with the positive supply VCC, its base connected to collector of the fifteenth transistor Q15 and its emitter connected to bases of the eleventh, twelfth and the fifteenth transistors Q11, Q12 and Q15.

Each of the first and the second transistors Q1 and Q2, composing a differential amplifier, is turned to ON and OFF alternately and complementarily by way of a positive feedback circuit including the third to seventh transistors Q3 to Q7.

Emitter current I6 of the differential amplifier is regulated by a first output flowing through the eleventh transistor Q11 of a first current mirror having the eleventh, twelfth, fourteenth and fifteenth transistors Q11, Q12, Q14 and Q15, and collector current I7 of the eighth transistor Q8, which is supplied to the capacitor C and collector of the second transistor Q2 of the differential amplifier, is regulated to the same value with a second output of the first current mirror flowing through the twelfth transistor Q12, by way of a second current mirror having the eighth to tenth transistors Q8 to Q10.

In the following paragraphs, oscillation of the current controlled oscillator of FIG. 3 is described, wherein each current value, resistance or capacitance is represented by the same symbol denoting each of the corresponding constant current sources, resistors and the capacitor.

The differential amplifier having the first and the second transistors Q1 and Q2 operates as a switch for charging and discharging the capacitor C. For illustration purposes, suppose a timing when the second transistor Q2, which has been ON and collector potential thereof is dropped, is turned to OFF.

The capacitor C begins to be charged with the collector current I7 of the eighth transistor Q8 and base potential of the seventh transistor Q7 is pushed, which is followed by base potential of the second and the fourth transistors Q2 and Q4. When base potential of the second and the fourth transistors Q2 and Q4 becomes higher than that of the first and the third transistor Q1 and Q3, both the second and the fourth transistors Q2 and Q4 become ON, and so, base potential of the fifth transistor Q5 is pulled down with potential drop of the second resistor R2, which is followed by base potential of the first and the third transistors Q1 and Q3 through the sixth transistor Q6.

Here, the collector current I7, which is the same with the second output of the first current mirror, is chosen to be smaller than the emitter current I6 of the differential amplifier (that is, the first output of the first current mirror). So, the second transistor Q2 turned to ON, the capacitor C begins in turn to be discharged through the second transistor Q2, until base potentials of the second and the fourth transistor Q2 and Q4 become lower than that of the first and the third transistors Q1 and Q3, which is beforehand pulled down with the potential drop of the second resistor R2.

When the base potential of the second and the fourth transistor Q2 and Q4 become lower than that of the first and the third transistors Q1 and Q3, the second and the fourth transistor Q2 and Q4 become OFF and the first and the third transistors Q1 and Q3 become ON, the second constant current I2 flows through the first resistor R1 instead of the second resistor R2 and, the base potential of the fifth transistor Q5 is pushed up to potential of the power supply VCC, which is followed by the base potential of the first and the second transistors Q1 and Q3.

Thus, one cycle of the oscillation is accomplished. By repeating the cycle, a triangle wave W, as illustrated in FIG. 5, is obtained from collector of the second transistor Q2, for example.

The amplitude and frequency of the triangle wave W are described referring to FIGS. 4 to 6.

As above described, the peak-to-peak value Vx of the triangle wave W of FIG. 5 is equal to the peak-to-peak value of the base potential of the second and the fourth transistor Q2 and Q4, which is equal to that of the fifth transistor Q5.

When the second and the fourth transistors Q2 and Q4 are OFF, the base potential of the fifth transistor is at potential of the power supply VCC, no current flowing through the second resistor R2. Conversely, when Q2 and Q4 are ON, the fifth transistor is pulled down by the potential drop caused by the second constant current I2 flowing through the second resistor R2. Therefore, Vx=I2×R2.

The emitter current I6 of the differential amplifier has been described to be larger than the collector current I7 of the eighth transistor Q8.

By way of example, consider a current ratio I6:I7=3:1 for obtaining a triangle wave having duty ratio of 2:1. The emitter size ratio of the eleventh transistor Q11 to the twelfth transistor Q12 and resistance of the fifth and sixth resistors R5 and R6 are chosen so that the first output through the eleventh transistor Q11, namely the emitter current I6, becomes three times of the second output through the twelfth transistor Q12 in the first current mirror having the eleventh, the twelfth, the fourteenth and the fifteenth transistors Q11, Q12, Q14 and Q15, wherein the first constant current I1 is input. The second output of the first current mirror is input through the ninth transistor Q9 of the second current mirror having the eighth to tenth transistors Q8 to Q10 and the third and the fourth resistors R3 and R4, which are chosen so that the same current with its input is output as the collector current I7 of the eighth transistor Q8 to the capacitor C and the second transistor Q2.

Thus, the current ratio I6:I7=3:1 is obtained. For simplifying the description, the emitter current I6 and the collector current I7 can be represented by equations I6=3I¼ and I7=I¼.

FIG. 4 is a schematic diagram for illustrating switching operation of the differential amplifier having the first, the second and the eleventh transistors Q1, Q2 and Q11, wherein a constant current I7 represents the collector current I7 of the eighth transistor Q8 of FIG. 3, a constant current I6 represents the collector current of the eleventh transistor Q11 (namely, the first output of the first current mirror of FIG. 3), and a switch SW corresponds to the second transistor Q2 of the differential amplifier.

When the switch SW is OFF, the constant current I7=I¼ flows into the capacitor C, while a current value corresponding to I6−I7=I½ flows out of the capacitor C, when the switch SW is ON. Therefore, the capacitor C is charged with a charging current of I¼ and discharged with a discharging current about two times greater than the charging current.

Thus, a triangle wave W of FIG. 5 having a duty ratio of about 2:1 is obtained in the conventional current controlled oscillator of FIG. 3. Accordingly its amplitude and frequency are functions of the constant currents I1 or I2.

However, in the circuit of FIG. 3, the switch SW is composed of the second transistor Q2, wherein a base current is included in the emitter current I6 of the differential amplifier, and so oscillation frequency $f$ of the conventional current controlled oscillator is adversely affected by current amplification efficiency $\beta$ of the second transistor Q2 depending on temperature, as follows.

Considering the base current, the collector current of the second transistor Q2 is expressed as $\kappa$I6, where $\kappa=\beta/(\beta+1)$. Therefore, a charging time T1, a discharging time T2 and oscillation frequency $f$ of the triangle wave W are given as follows when I6=3I¼ and I7=I¼;

$$T1 = 4C \cdot Vx/I1, \qquad (1)$$

$$T2 = 4C \cdot Vx/((3\kappa - 1)I1), \qquad (2)$$

$$f = \frac{1}{T1 + T2} = \frac{I1}{6C \cdot Vx} \cdot \frac{3\kappa - 1}{2\kappa} . \qquad (3)$$

From equation (3), deviation $e=(fo-f)/fo$ of the oscillation frequency $f$ compared to an ideal oscillation frequency $fo$ when the switch SW is an ideal switch, that is when $\kappa=1$, is obtained as follows;

$$e=1-(3\kappa-1)/2\kappa=1/(2\beta). \qquad (4)$$

As shown by the above equation, the oscillation frequency $f$ of the conventional current controlled circuit of FIG. 3 is adversely affected by the current amplification efficiency $\beta$ of the second transistor Q2 depending on temperature.

SUMMARY OF THE INVENTION

Therefore, a primary object of the present invention is to provide a current controlled oscillator wherein the oscillation frequency is highly stabilized against a wide range of outer temperature variation by compensating for the effect of the current amplification efficiency $\beta$ of the transistor, with a simple circuit configuration with minimal power dissipation.

Accordingly, the present invention provides a current controlled oscillator comprising a differential amplifier having a pair of transistors, a capacitor connected between collectors of the pair of transistors, and a positive feedback circuit for turning each of the pair of transistors to ON and OFF alternately and complementarily, further comprises temperature compensation circuit for supplying one of the collectors of the pair of transistors with a compensation current proportional to a base current of one of the pair of transistors at status ON together with a constant current.

Preferably the temperature compensation circuit comprises a compensation transistor having a collector connected to a collector of an output transistor of a current mirror for outputting the same current with the constant current, an emitter connected to a base of the output transistor, and a base connected to a collector of an input transistor of the current mirror.

In this way, the oscillation frequency in the current controlled oscillator is highly stabilized against a wide range of outer temperature variation by compensating for the effect of the current amplification efficiency of the transistor (by setting the current ratio of the compensation current to the base current and considering the duty ratio of the charging time to discharging time of the capacitor), with a simple circuit configuration by adding a transistor with minimal power dissipation.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

DETAILED DESCRIPTION OF THE PREFERRED EMBODIMENTS

Figure 1:
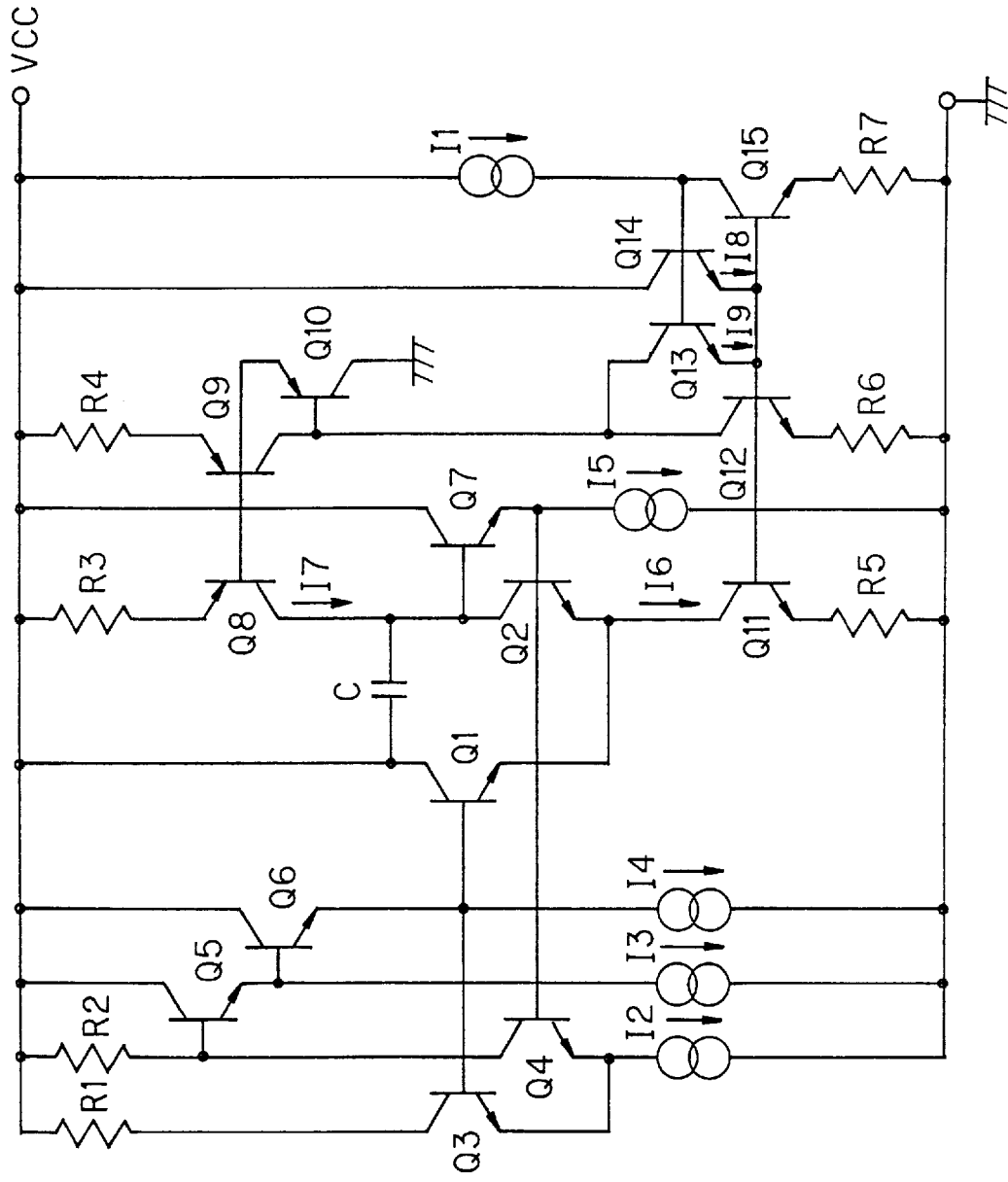
FIG. 1 is a circuit diagram illustrating a current controlled oscillator according to one embodiment of the invention.
Figure 3:
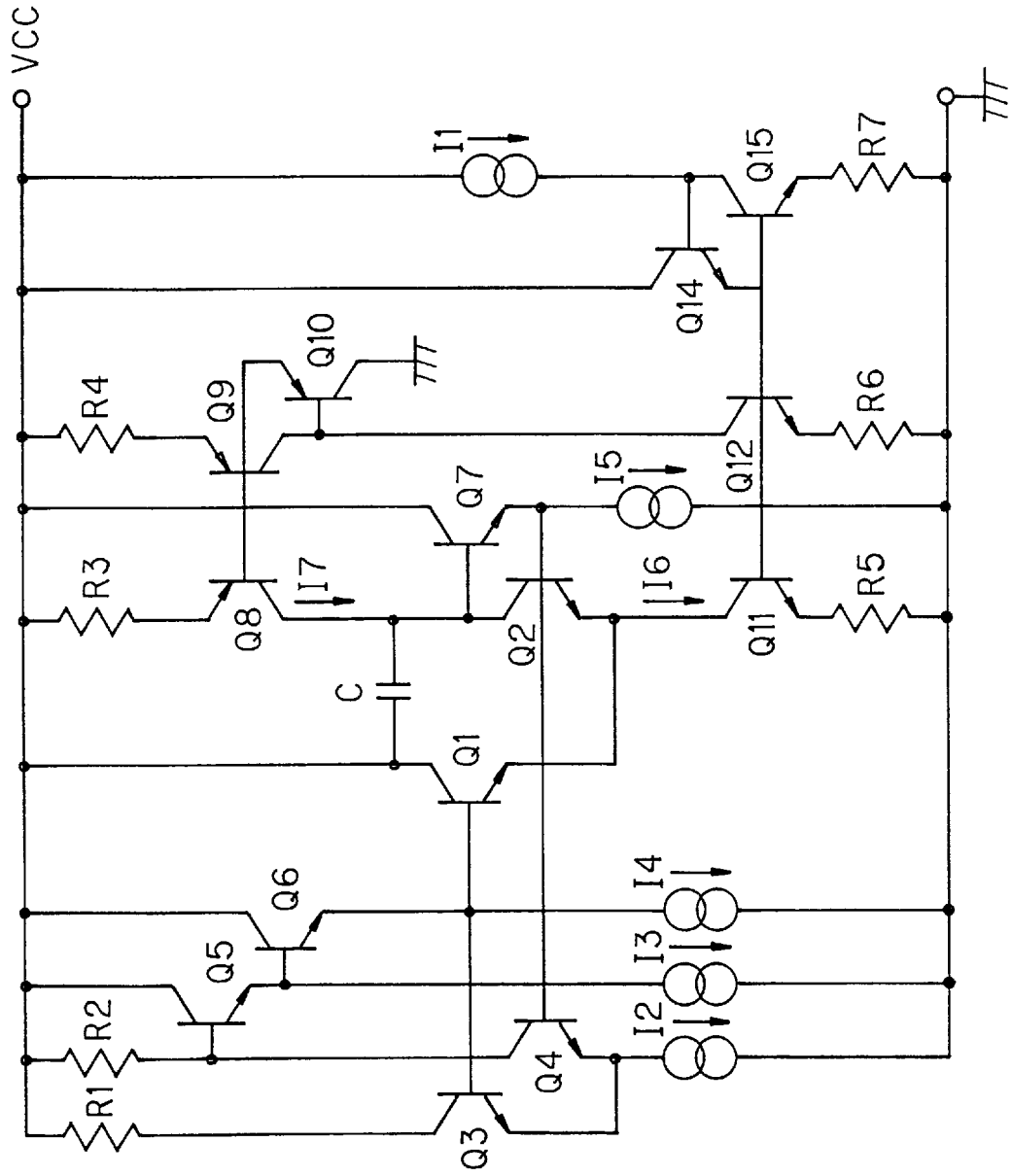
FIG. 3 is a circuit diagram illustrating an example of a conventional current controlled oscillator.
Figure 4:
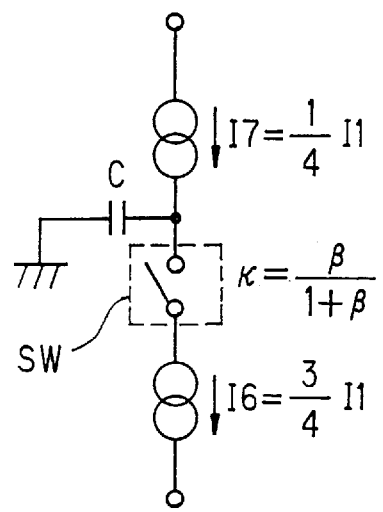
FIG. 4 is a schematic diagram for illustrating switching operation of the differential amplifier having the first, the second and the eleventh transistors Q1, Q2 and Q11 of FIG. 3.
Figure 5:
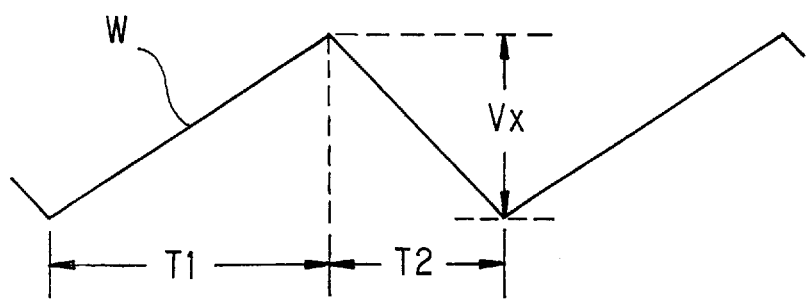
FIG. 5 illustrates a triangle wave W obtained from the current controlled oscillator of FIG. 3.

FIG. 1 is a circuit diagram illustrating a current controlled oscillator according to one embodiment of the present invention, wherein is provided, in addition to the current controlled oscillator of FIG. 3, a temperature compensation circuit having a thirteenth transistor Q13 of npn type with its collector coupled to collector of the twelfth transistor Q12, its emitter connected to bases of the eleventh, the twelfth and the fifteenth transistors Q11, Q12 and Q15 and its base coupled to base of the fourteenth transistor Q14.

As the current controlled oscillator of FIG. 1 has the same configuration to that of FIG. 3 except for the temperature compensation circuit the same parts thereof are denoted by the same symbols, as described above.

In the conventional current controlled oscillator of FIG. 3, the discharging time T2 of the capacitor C is prolonged because of the base current of the second transistor Q2. In this embodiment, this prolongation is compensated by shortening the charging time T1 of the capacitor C by adding a compensation current Ic to the collector current I7 of the eighth transistor Q8, proportional to the base current sensible to the temperature variation.

In the first current mirror of FIG. 1, having the eleventh, twelfth, fourteenth and fifteenth transistors Q11, Q12, Q14 and Q15 and added with the thirteenth transistor Q13, the sum of currents (I8+I9) flowing through the thirteenth and the fourteenth transistors Q13 and Q14 is equal to sum of base currents of the eleventh, twelfth and fifteenth transistors Q11, Q12 and Q15. Therefore, the collector current I7 of the eighth transistor Q8 of the embodiment of FIG. 1 is given as follows when the current ratio of the first output, the second output and the input of the first current mirror are chosen as 3:1:4, on condition that the second, eleventh, twelfth and fifteenth transistors Q2, Q11, Q12 and Q15 have the same current amplification efficiency $\beta$:

$$I7 = I\frac{1}{4} + Ic = (1+\eta-\eta\kappa) \cdot I\frac{1}{4} \quad (5)$$

where $\eta$ is a coefficient between 0 to 8 determined by emitter size ratio of the thirteenth transistor Q13 to the fourteenth transistor Q14.

As described above, the charging time T1 and the discharging time T2 are given by equations (1) and (2) in the current controlled oscillator of FIG. 3 for oscillating the triangle wave W with a duty ratio 2:1, without the temperature compensation circuit.

$$T1 = 4C \cdot Vx/I1, \quad (1)$$

$$T2 = 4C \cdot Vx/((3\kappa-1)I1), \quad (2)$$

When the compensation current Ic is added, equations (1) and (2) become as follows:

$$T1 = 4C \cdot Vx/((1+\eta-\eta\kappa)I1)$$

$$T2 = 4C \cdot Vx/((3\kappa-1-\eta+\eta\kappa)I1)$$

Further, they are generalized as follows when the duty ratio is $\alpha:1$, L being a constant:

$$T1 = L/(1+\eta-\eta\kappa)$$

$$T2 = L/((\alpha+1)\kappa-1-\eta+\eta\kappa)$$

So, the deviation $e=(fo-f)/fo$ of the oscillation frequency $f$ compared to an ideal oscillation frequency $fo$ when $\kappa=1$ becomes as follows:

$$e = \frac{\alpha\kappa - (1+n-n\kappa)((\alpha+1+n)\kappa - 1 - n)}{\alpha\kappa} \quad (6)$$

$$= \frac{(1-\kappa)((1-\kappa)n(\alpha+n+1) + 1 + n - n\alpha)}{\alpha\kappa}$$

Therefore, by selecting value of $\eta$ to make $\eta\alpha-1-\eta=0$, that is, $\eta=1/(\alpha-1)$, the frequency deviation $e_r$ of this embodiment can be limited by terms proportional to $(1-\kappa)^2$ as follows:

$$e_r = \frac{n(\alpha+n+1)(1-\kappa)^2}{\alpha\kappa} = \frac{\alpha}{(\alpha-1)^2\beta(\beta+1)} \quad (7)$$

when $\eta=1/(\alpha-1)$ and $\alpha>1$.

The frequency deviation $e_r$ of equation (7) is reduced by $$\frac{\alpha^2}{(\alpha-1)^2(\beta+1)}$$

compared to the frequency deviation e of the current controlled oscillator of FIG. 3 without the temperature compensation circuit, that is, the deviation $e=1/\alpha\beta$ of equation (6) when $\eta=0$.

When the duty ratio is 2:1, for example, the frequency deviation can be reduced by $4/(\beta+1)$, about $10^{-1}$, by setting $\eta=1$, which is obtained by preparing the emitter size ratio of the thirteenth transistor Q13 to the fourteenth transistor Q14 to be 3:5 when the current ratio is 3:1:4 in the first current mirror having the eleventh, twelfth and fifteenth transistors Q11, Q12 and Q15 and the current ratio is 1:1 in the second current mirror having the eighth and the ninth transistors Q8 and Q9.

For compensating correctly the frequency deviation caused by the temperature variation, the second transistor Q2 is preferably formed in the same way on the same IC chip with the first current mirror and the temperature compensation circuit of the thirteenth transistor Q13.

Thus, in the current controlled oscillator according to this embodiment, the oscillation frequency is highly stabilized for a wide range of outer temperature variation by compensating for the effect of the current amplification efficiency $\beta$ of the transistor.

Figure 2:
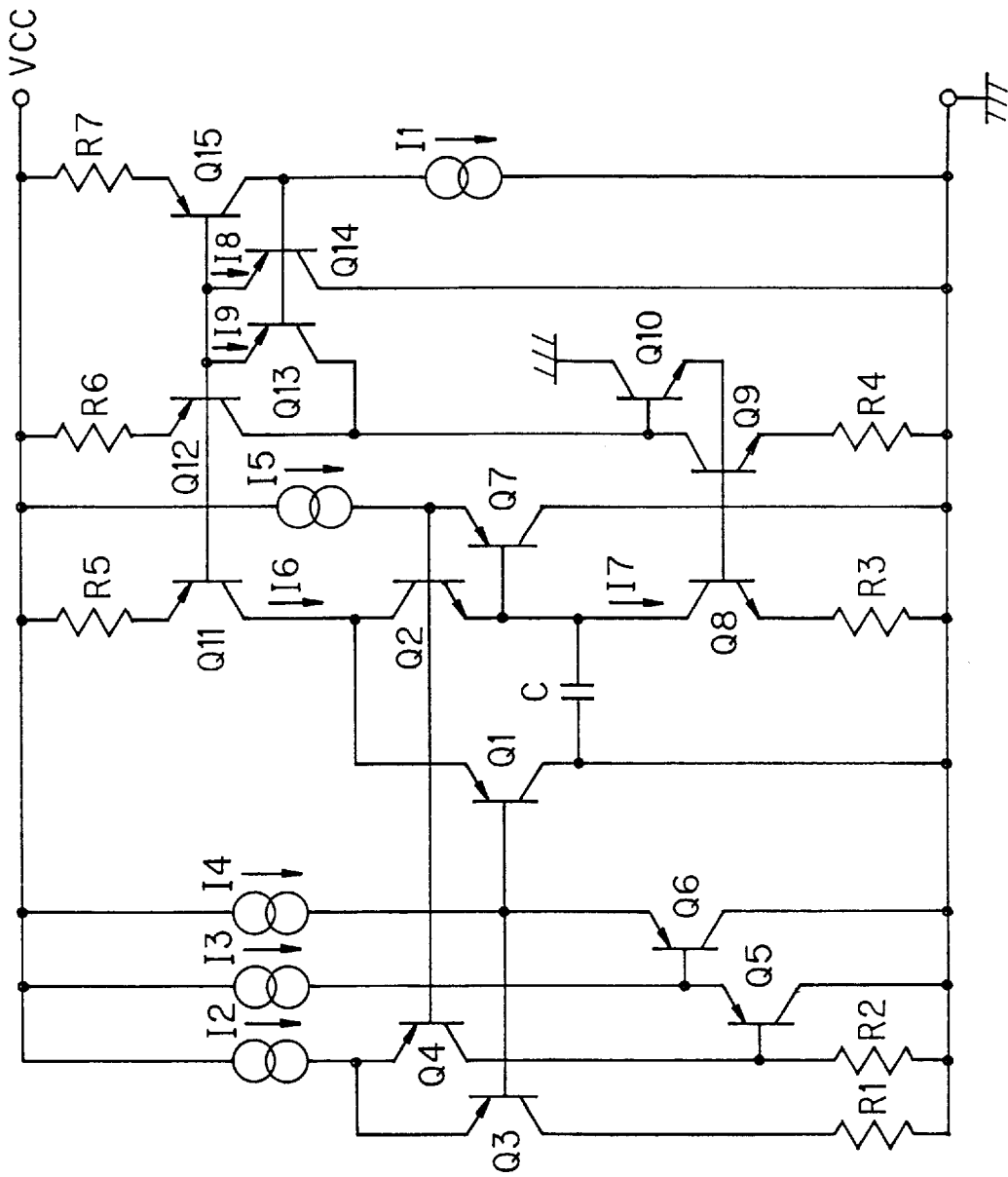
FIG. 2 is a circuit diagram illustrating another embodiment of the invention.

Heretofore, the present invention is described in connection with the current controlled oscillator of FIG. 1, but there can be considered a various applications in the scope of the invention. For example, as shown in FIG. 2, the positive feedback circuit including the third to seventh transistors Q3 to Q7 of FIG. 1 may be replaced with any other positive feedback circuit for turning the first and the second transistors Q1 and Q2 to ON and OFF alternately. Alternatively, the npn transistors Q1 to Q7 and Q12 to Q15 and the pnp transistors Q8 to Q10 may be replaced with corresponding pnp transistors Q1 to Q7 and Q12 to Q15 and corresponding npn transistors Q8 to Q10.

What is claimed is:

1. A current controlled oscillator comprising a differential amplifier comprising a pair of transistors, a capacitor connected between collectors of the pair of transistors, a positive feedback circuit for turning each of the pair of transistors to ON and OFF alternately and complementarily; and, a temperature compensation circuit for supplying one of the collectors of the pair of transistors with a compensation current proportional to a base current of one of the pair of transistors at status ON together with a constant current; said temperature compensation circuit comprising a compensation transistor having a collector connected to a collector of an output transistor of a current mirror for outputting the same current with said constant current, an emitter connected to a base of said output transistor, and a base connected to a collector of an input transistor of said current mirror.

2. A current controlled oscillator recited in claim 1; wherein current ratio of said compensation current to said base current is determined considering duty ratio of charging time to discharging time of the capacitor.

3. A current controlled oscillator recited in claim 1, wherein the pair of transistors and said output transistor are prepared on an IC chip to have the same characteristic.

\* \* \* \* \*